(12) United States Patent
Kang et al.

(10) Patent No.: US 7,750,432 B2
(45) Date of Patent: Jul. 6, 2010

(54) SEMICONDUCTOR FUSE BOX AND METHOD FOR FABRICATING THE SAME

(75) Inventors: Min-Sung Kang, Yongin-si (KR);
Kyung-Seok Oh, Seongnam-si (KR);
Joo-Sung Park, Yongin-si (KR);
Jung-Hyun Shin, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/283,457

(22) Filed: Sep. 12, 2008

(65) Prior Publication Data

US 2009/0014829 A1    Jan. 15, 2009

Related U.S. Application Data

(62) Division of application No. 11/595,253, filed on Nov. 10, 2006, now Pat. No. 7,439,102, which is a division of application No. 10/960,732, filed on Oct. 7, 2004, now Pat. No. 7,154,160.

(30) Foreign Application Priority Data

Oct. 7, 2003    (KR)    ............................. 20030069695

(51) Int. Cl.
*H01L 29/93*    (2006.01)
(52) U.S. Cl. ....................... 257/529; 257/528; 257/530; 438/200; 438/207; 438/253
(58) Field of Classification Search .................. 438/281
See application file for complete search history.

(56) References Cited

U.S. PATENT DOCUMENTS

| 6,376,894 B1 * | 4/2002 | Ikegami et al. ............... 257/529 |
| 6,486,526 B1 * | 11/2002 | Narayan et al. .............. 257/529 |
| 2004/0021199 A1 * | 2/2004 | Trivedi ....................... 257/529 |

* cited by examiner

*Primary Examiner*—N Drew Richards
*Assistant Examiner*—Kyoung Lee
(74) *Attorney, Agent, or Firm*—Monica H. Choi

(57) ABSTRACT

A semiconductor fuse box includes a fuse structure and a protective structure disposed between the fuse structure and an integrated circuit structure. The protective structure has at least one irregular side surface. The protective structure (which may also include a pad formed there-under) extends beyond a bottom of the fuse structure. Such an irregular side surface and such an extension of the protective structure minimize propagation of damaging energy to the adjacent integrated circuit structure when a laser beam is directed to the fuse structure.

17 Claims, 9 Drawing Sheets

SEMICONDUCTOR FUSE BOX AND METHOD FOR FABRICATING THE SAME

The present application is a divisional of an earlier filed patent application with Ser. No. 11/595,253 filed on Nov. 10, 2006, now U.S. Pat. No. 7,439,102, for which priority is claimed. This earlier filed patent application with Ser. No. 11/595,253 is in its entirety incorporated herewith by reference.

The earlier filed patent application with Ser. No. 11/595,253 is a divisional of U.S. Ser. No. 10/960,732 filed on Oct. 7, 2004 now U.S. Pat. No. 7,154,160.

The present application also claims priority under 35 USC §119 to Korean Patent Application No. 2003-0069695, filed on Oct. 7, 2003, in the Korean Intellectual Property Office, the disclosure of which is incorporated herein in its entirety by reference. A certified copy of Korean Patent Application No. 2003-0069695 is contained in the first parent patent application with Ser. No. 10/960,732.

BACKGROUND OF THE INVENTION

1. Field of the Invention

The present invention relates generally to fuse boxes in integrated circuits, and more particularly, to a semiconductor fuse box with protective structures for effectively preventing damage to integrated circuit structures near a cut fuse structure.

2. Description of the Related Art

A semiconductor fuse box is commonly used in integrated circuits for providing connection adjustments. An example application of a semiconductor fuse box is for substituting redundancy cells for at least one inoperative cell of a memory device. To this end, fuses associated with the inoperative cells are cut by a laser beam within the fuse box to disable the inoperative cells. Thereafter, the redundancy cells are substituted for the inoperative cells. The laser beam is directed to a fuse comprised of polysilicon or of polysilicon and metal silicide, for cutting such a fuse.

FIGS. 1, 2, and 3 are cross-sectional views illustrating physical damage to the semiconductor fuse box when the laser beam is directed to the fuse box according to the prior art. Referring to FIG. 1, a semiconductor fuse box 60 includes fuse lines A, B, and C formed on a fuse buffer 20 that is formed on a semiconductor substrate 10. The fuse lines A, B, and C are spaced a predetermined distance apart from each other.

The fuse buffer 20 is comprised of a shallow trench isolation film or is a doped region of the semiconductor substrate 10. Each of the fuse lines A, B, and C is comprised of a respective fuse 25 and a respective fuse cap 30. A passivation layer 40 surrounds the fuse lines A, B, and C on the fuse buffer 20. A fuse window 50 is formed through the passivation layer 40 over the fuse lines A, B, and C.

During testing of the memory device including the fuse box 60, assume at least one cell of the memory device is determined to be inoperative. In that case, assume that the fuse line B associated with the inoperative cell is cut after stopping such testing for substituting the inoperative cell with a redundancy cell. Thus, a laser beam with an energy $P_A$ is directed to the fuse line B.

Referring to FIG. 1, upon irradiation of the laser beam, the energy of the laser beam becomes divided into a first energy $P_{B1}$ directed to the fuse line B and second energies $P_{B2}$ and $P_{B3}$ directed to the passivation layer 40. Referring to FIG. 2, the first energy $P_{B1}$ melts the fuse line B to expose the fuse buffer 20, and further transfers third energies $P_{C1}$ and $P_{C2}$ to the passivation layer 40.

Simultaneously in FIG. 1, the second energies $P_{B2}$ and $P_{B3}$ melt the passivation layer 40 to form a small groove 52 around the fuse line B. Then referring to FIG. 2, the second energies $P_{B2}$ and $P_{B3}$ are transformed into fourth energies $P_{C3}$ and $P_{C4}$ with decreased intensity from the energies $P_{B2}$ and $P_{B3}$. Referring to FIGS. 2 and 3, the third and fourth energies $P_{C1}$ and $P_{C2}$ and $P_{C3}$ and $P_{C4}$ melt the fuse buffer 20 and the passivation layer 40 adjacent to the fuse line B. Thus, larger grooves 54 and 56 are formed sequentially in FIGS. 2 and 3 exposing the adjacent fuse lines A and C.

Unfortunately, the exposed fuse lines A and C may be damaged by moisture in the air or during subsequent fabrication processes. Thus, it is desired to prevent the adjacent fuse lines A and C from being exposed after cutting the fuse line B.

U.S. Pat. No. 5,420,455 to Gilmour et al. discloses a fuse damage protection device with a barrier formed between the cut fuse line and an adjacent integrated circuit element. Such a barrier has a high melting point to prevent damage to the adjacent integrated circuit element when a laser beam is directed to the cut fuse line.

However, in U.S. Pat. No. 5,420,455 to Gilmour et al., the barrier extends from the top surface of the passivation layer surrounding the fuse line down to just half of the height of the fuse line. Thus, the adjacent integrated circuit element may still be damaged when the laser beam is directed to the fuse line. In addition, the barrier of U.S. Pat. No. 5,420,455 to Gilmour et al. simply has flat side surfaces that do not effectively absorb damaging forces to the passivation layer from the laser beam.

Thus, a mechanism is desired for more effectively protecting the adjacent integrated circuit element from the laser beam cutting the fuse line.

SUMMARY OF THE INVENTION

Accordingly, a protective structure is formed having at least one irregular side surface and extending beyond the height of a fuse structure to more effectively protect an adjacent integrated circuit structure.

In one embodiment of the present invention, a semiconductor fuse box includes a fuse structure and a protective structure disposed between the fuse structure and an integrated circuit structure. The protective structure has at least one irregular side surface.

In a further embodiment of the present invention, a passivation layer surrounds the fuse structure, and the protective structure is comprised of a material filling a protective opening through the passivation layer.

In one example embodiment of the present invention, for forming the protective opening, a plurality of initial openings are formed through the passivation layer. Thereafter, an isotropic etch is performed such that the initial openings expand to merge together into the protective opening with the at least one irregular side wall.

In a further embodiment of the present invention, the fuse structure is comprised of a fuse and a fuse cap disposed on the fuse.

In another embodiment of the present invention, the irregular side surface is comprised of a plurality of dimples formed into the side surface.

In a further embodiment of the present invention, the protective structure is disposed between the fuse structure and another fuse structure.

In another embodiment of the present invention, the semiconductor fuse box further includes an additional protective structure having at least one irregular side surface and disposed between the fuse structure and another integrated circuit structure.

In a further embodiment of the present invention, the protective structure extends beyond a top and a bottom of the fuse structure along the height of the fuse structure.

In an example embodiment of the present invention, the protective structure is comprised of one of polysilicon or a material having a melting point higher than that of the fuse structure.

In a further embodiment of the present invention, the semiconductor fuse box further includes a pad formed at a bottom of the protective structure and support lines formed to the sides of the pad.

In another embodiment of the present invention, a semiconductor fuse box includes a fuse structure and a protective structure disposed between the fuse structure and an integrated circuit structure. The semiconductor fuse box also includes a pad formed at a bottom of the protective structure and support lines formed to the sides of the pad.

In an example embodiment of the present invention, each of the pad and the support lines is comprised of one of polysilicon or a material having a melting point higher than that of the fuse structure.

In a further embodiment of the present invention, the pad and the support lines are formed at a lower depth from a bottom of the fuse structure.

In this manner, the protective structure with or without the bottom pad extends beyond the top and bottom along the height of the fuse structure to more effectively prevent damage to the adjacent integrated circuit structure from a laser beam directed to the fuse structure. In addition, the irregular side surfaces of the protective structure more effectively absorb the damaging forces of the laser beam directed to the fuse structure.

BRIEF DESCRIPTION OF THE DRAWINGS

The above and other features and advantages of the present invention will become more apparent when described in detail as exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10, 11, 12, and 13 refer to elements having similar structure and/or function.

DETAILED DESCRIPTION OF THE INVENTION

Figure 1:
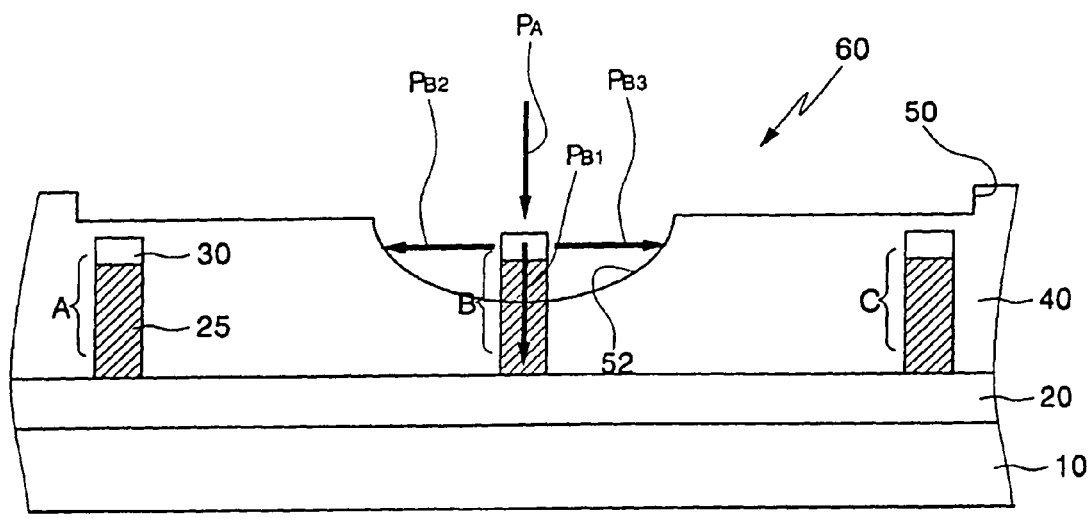
FIGS. 1, 2, and 3 are cross-sectional views illustrating damage from irradiation of a laser beam in a fuse box, according to the prior art.
Figure 2:
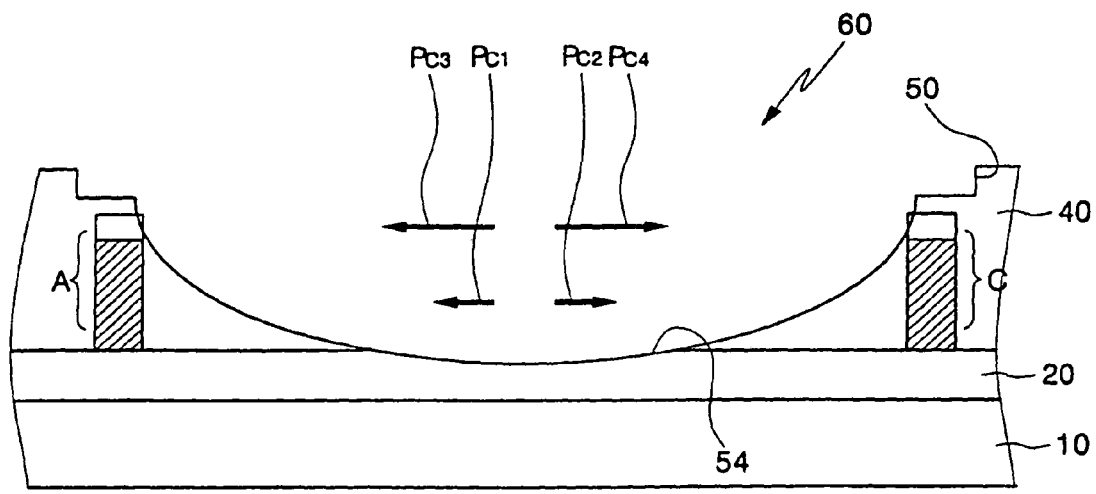
Figure 3:
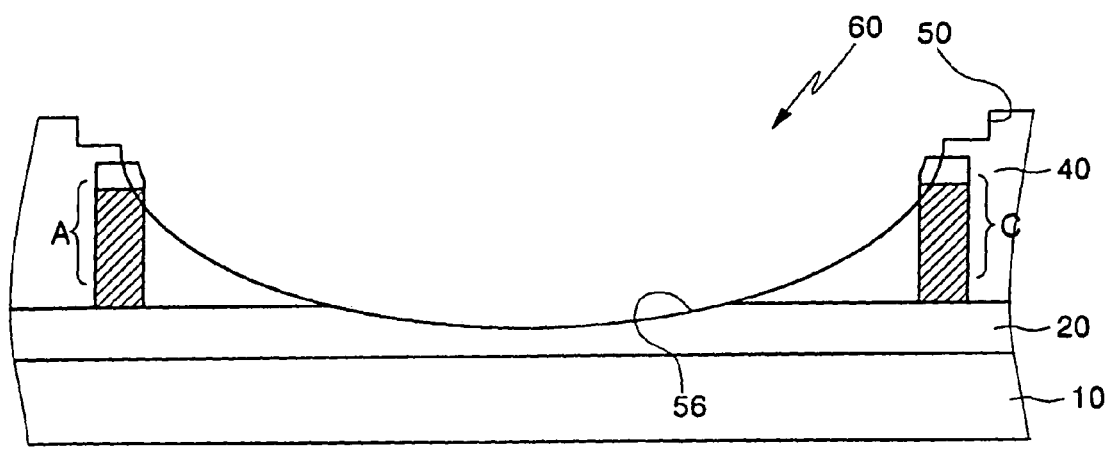
Figure 4:
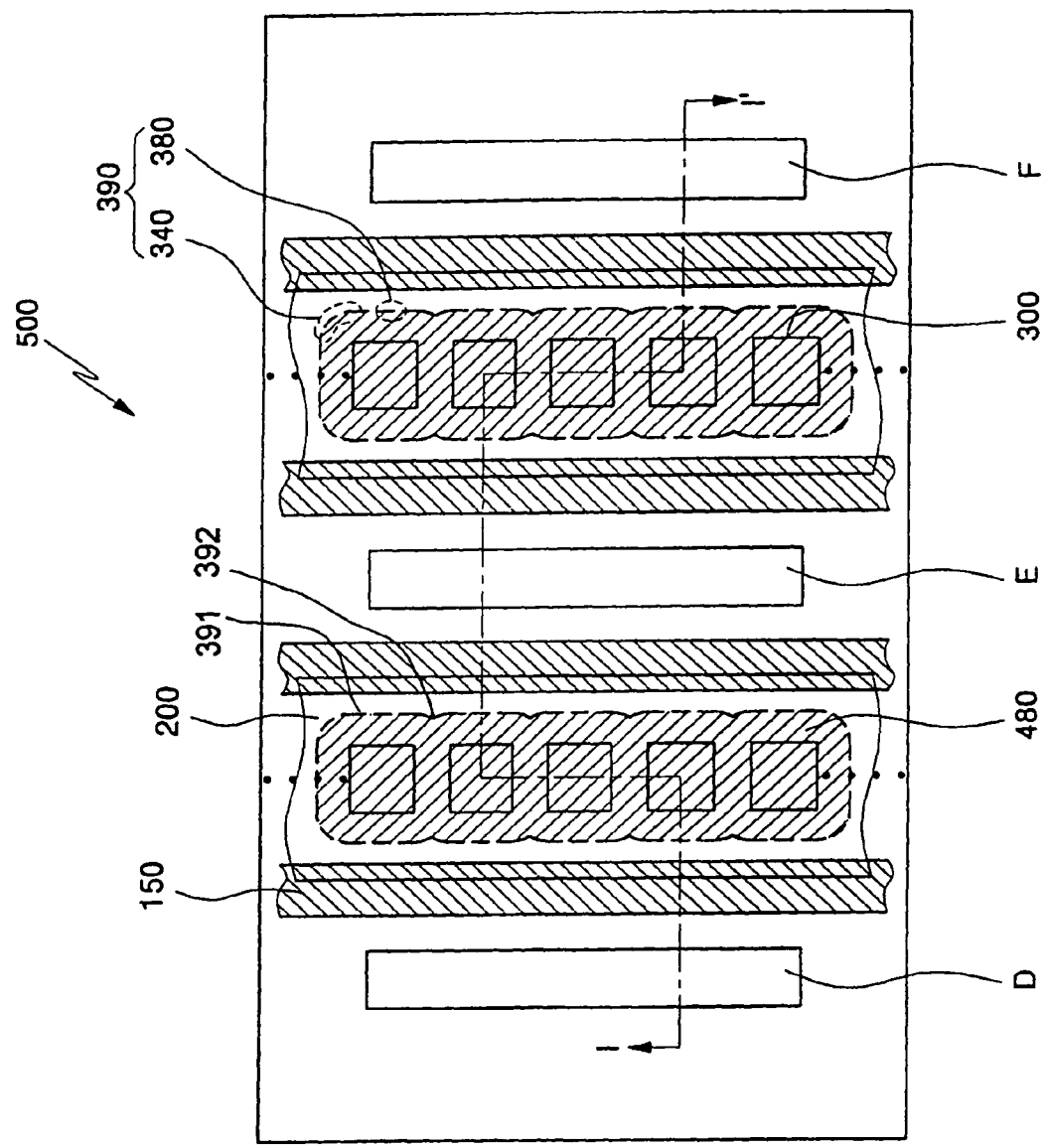
FIG. 4 is a layout view showing a semiconductor fuse box according to an embodiment of the present invention.

FIG. 4 is a layout view of a semiconductor fuse box 500 formed according to an embodiment of the present invention. FIGS. 5, 6, 8, and 10 show cross-sectional views for fabricating the semiconductor fuse box 500 along line I-I' of FIG. 4 according to a first embodiment of the present invention.

Figure 5:
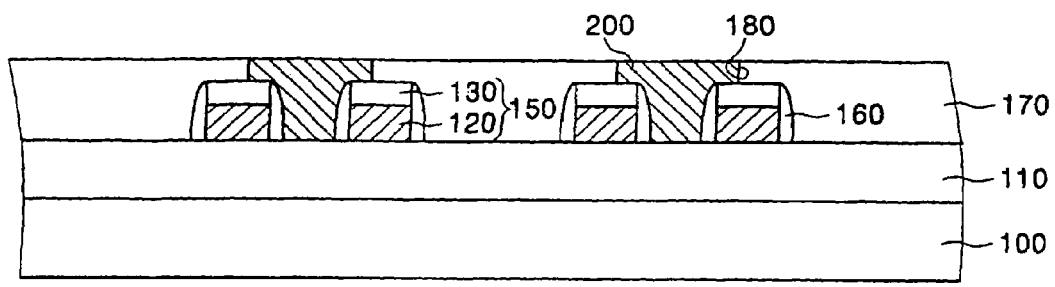
FIGS. 5, 6, 8, and 10 are cross-sectional views illustrating a method of fabricating the semiconductor fuse box along line □-□' of FIG. 4 according to a first embodiment of the present invention.

Referring to FIGS. 4 and 5, a fuse buffer 110 is formed onto a semiconductor substrate 100 that is comprised of silicon in one embodiment of the present invention. The fuse buffer 110 is a shallow trench isolation structure comprised of an insulating material in one embodiment of the present invention. Alternatively, the fuse buffer 110 is an active region with a dopant implanted into a predetermined depth of the semiconductor substrate 100. Processes for forming such a fuse buffer 110 are individually known to one of ordinary skill in the art.

Further referring to FIGS. 4 and 5, a pair of two adjacent support lines 150 are formed on the fuse buffer 110. Support spacers 160 are formed onto the side walls of each support line 150. Each support line 150 includes a support pattern 120 and a support cap 130 stacked thereon. The support pattern 120 is comprised of polysilicon and a metal having a relatively high melting point stacked thereon, or vice versa, in one embodiment of the present invention. Alternatively, the support pattern 120 is comprised of just the metal having the relatively high melting point.

The support cap 130 and the support spacers 160 are each comprised of a respective insulating material having a same etch selectivity. For example, the support cap 130 and the support spacers 160 are comprised of silicon nitride ($Si_3N_4$).

Further referring to FIG. 5, a wall supporting layer 170 is deposited to surround the support lines 150. In one embodiment of the present invention, the wall supporting layer 170 is comprised of an insulating material having an etch selectivity different from the fuse buffer 110.

Subsequently, a pad hole 180 is formed by etching away the portion of the wall supporting layer 170 between the pair of the two adjacent support lines 150. The pad hole 180 is filled with a material to form a support pad 200. In one embodiment of the present invention, the support pad 200 is comprised of polysilicon or a metal having a relatively high melting point.

Figure 6:
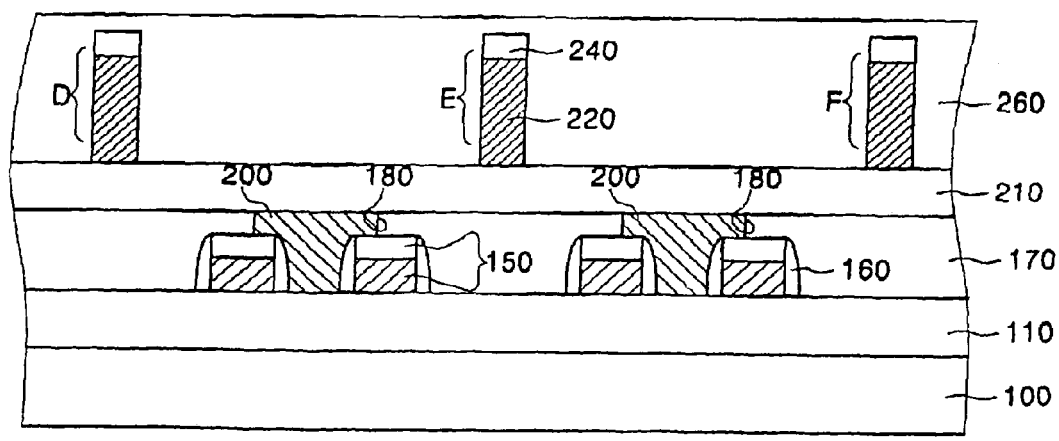

Referring to FIGS. 5 and 6, a fuse supporting layer 210 is formed onto exposed surfaces of the wall supporting layer 170 and the support pad 200. Thereafter, fuse structures D, E, and F are formed on the fuse supporting layer 210, and are spaced apart with a distance that is larger than that between the pair of two adjacent support lines 150.

Further referring to FIG. 6, a passivation layer 260 is deposited on the fuse supporting layer 210 to surround the fuse structures D, E, and F. The passivation layer 260 is comprised of an insulating material having a substantially same etch selectivity as the fuse supporting layer 210.

Each of the fuse structures D, E, and F includes a fuse 220 and a fuse cap 240 stacked thereon. The fuse 220 is comprised of at least one layer of metal having a relatively high melting point. Alternatively, the fuse 220 is comprised of metal silicide and doped polysilicon stacked thereon, or vice versa. The melting point of the material comprising the support pattern 120 and the support pad 200 is higher than that of the fuse 220 in one embodiment of the present invention. The fuse cap 240 is comprised of an insulating material having an etch selectivity different from that of the passivation layer 260.

Subsequently referring to FIGS. 4 and 6, a plurality of initial openings 300 are formed through the passivation layer 260 and the wall supporting layer 210. The initial openings 300 are disposed along and over the length of the support pad 200 to expose portions of the support pad 200. In one embodiment of the present invention, the initial openings 300 have a square shape. However, the present invention may be practiced with any other shapes for the initial openings 300.

The initial openings 300 are formed using a mask of such openings formed through a photo-resist layer on the passivation layer 260. The photo-resist mask is used in an anisotropic (i.e., directional) etch process for forming the initial openings through the passivation layer 260 and the wall supporting layer 210.

After formation of the initial openings 300, the photo-resist layer is removed from the passivation layer 260. Thereafter, an isotropic (i.e., non-directional) etch process is performed with the initial openings 300. The isotropic etch process may be a wet or a dry etch process. During such an isotropic etch process, the area of each initial opening 300 expands until such expanding openings 300 eventually merge together to form a protective opening 390. A portion of the support pad 200 is exposed through the protective opening 390.

Figure 8:
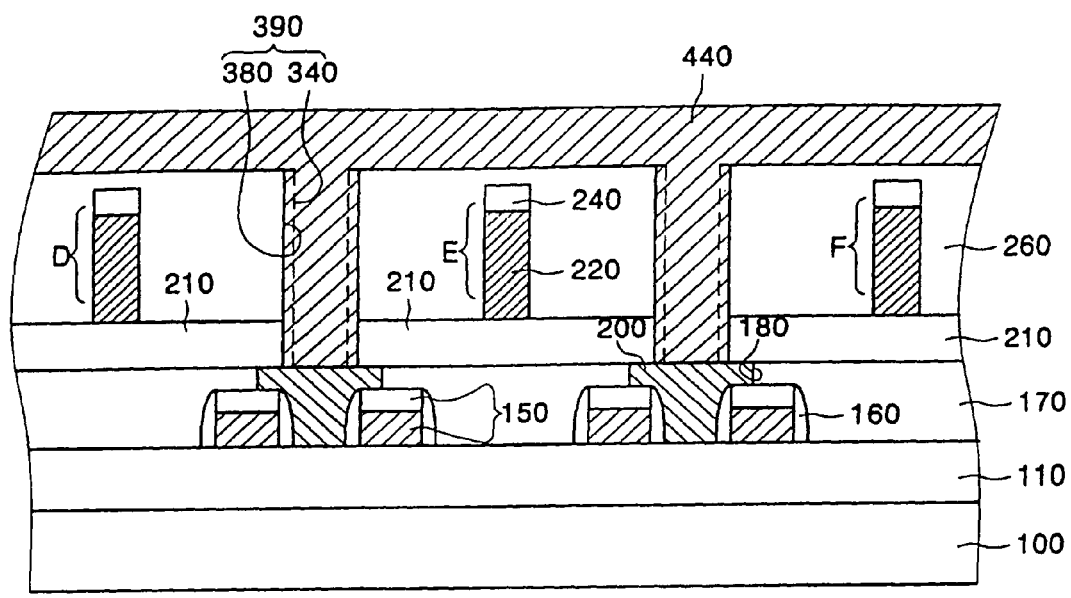

Further referring to FIG. 4, in this manner of forming the protective opening 390, dimples 392 are formed into side walls 391 of the protective opening 390 such that the side walls 391 are irregular (i.e. not flat). Subsequently referring to FIGS. 4 and 8, a material 440 is deposited into the protective opening 391 to form a protective structure. Such a material also initially covers the passivation layer 260. Such a material is comprised of polysilicon or a metal with a melting point higher than that of the fuse 220. FIG. 8 shows the protective opening 390 with a dashed line 340 illustrating a narrower width for a dimple 392 or a rounded corner 340 formed into sidewalls 391 and 380 of the protective opening 390 from the isotropic etch process.

Figure 10:
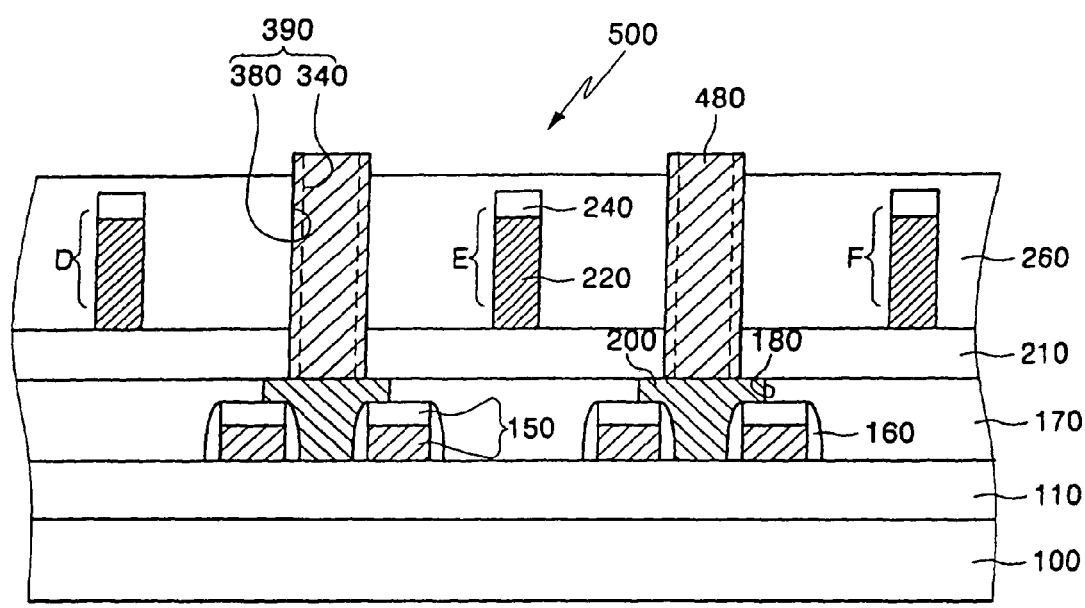

Referring to FIGS. 4, 8, and 10, another etch process is performed on the material 440 to etch away the portion of the material 440 on the top surface of the passivation layer 260. The material 440 remaining within the protective opening 390 forms a protective structure 480 disposed between the fuse structure E and another fuse structure F. Similarly, in FIGS. 5, 6, 8, and 10, an additional protective structure 480 is formed between the fuse structure E and the fuse structure D.

In this manner referring to FIG. 10, a portion of the protective structure 480 extends beyond the top surface of the passivation layer 260. Thus, the protective structure 480 is formed to extend beyond the top and the bottom of the fuse structure E along the height of the fuse structure E.

The bottom of the fuse structure E is the bottom surface of the fuse 220 abutting the fuse supporting layer 210. The top of the fuse structure E is the top surface of the fuse cap 240 abutting the insulating material of the passivation layer 260.

The support pad 200 and the supporting lines 150 are formed in the wall supporting layer 170 that is below the fuse supporting layer 210. Thus, the support pad 200 and the supporting lines 150 are formed at a deeper level down from the bottom of the fuse 220.

In this manner, the semiconductor fuse box 500 includes two protective structures 480 disposed to the sides of the fuse structure E. In addition, a respective support pad 200 is formed at the bottom of each of the protective structures 480. Furthermore, each protective structure 480 has irregular side surfaces 391 with dimples formed into the side surfaces 391.

Each protective structure 480 is disposed between the fuse structure E and an integrated circuit structure. In the example of FIG. 10, the protective structure 480 disposed to the right of the fuse structure E is disposed between the fuse structure E and another fuse structure F. Similarly, the protective structure 480 disposed to the left of the fuse structure E is disposed between the fuse structure E and another fuse structure D.

Figure 7:
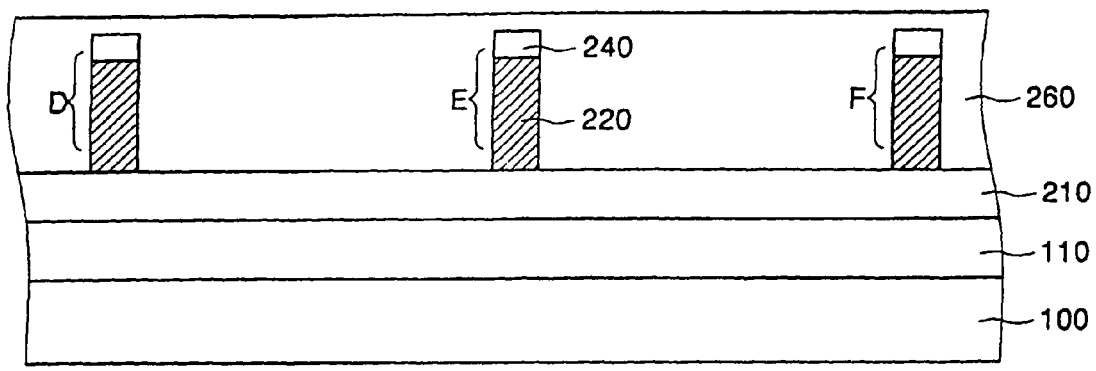
FIGS. 7, 9, and 11 are cross-sectional views illustrating a method for fabricating the semiconductor fuse box along line □-□' of FIG. 4 according to a second embodiment of the present invention.
Figure 9:
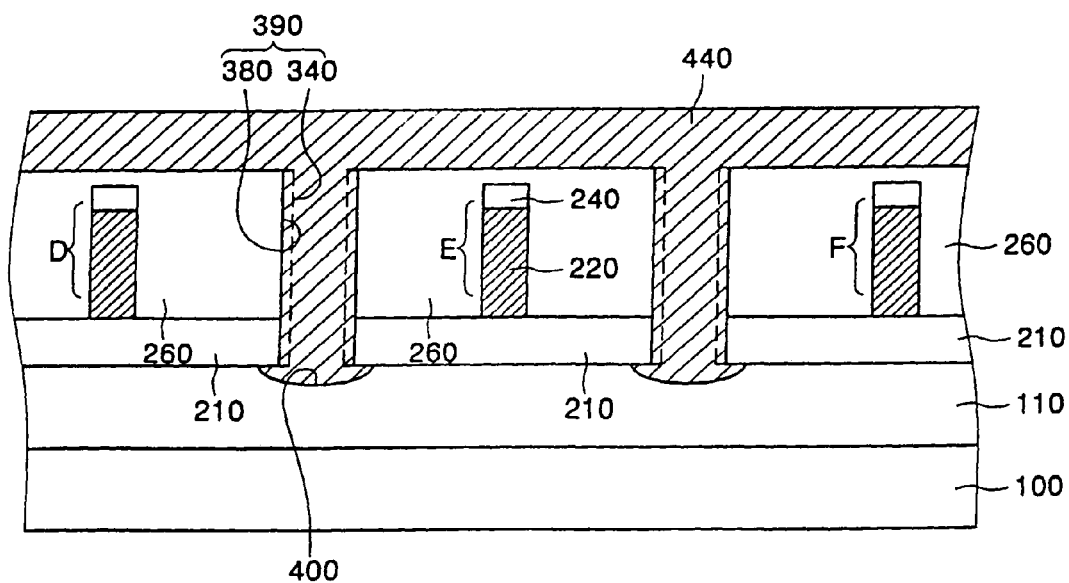
Figure 11:
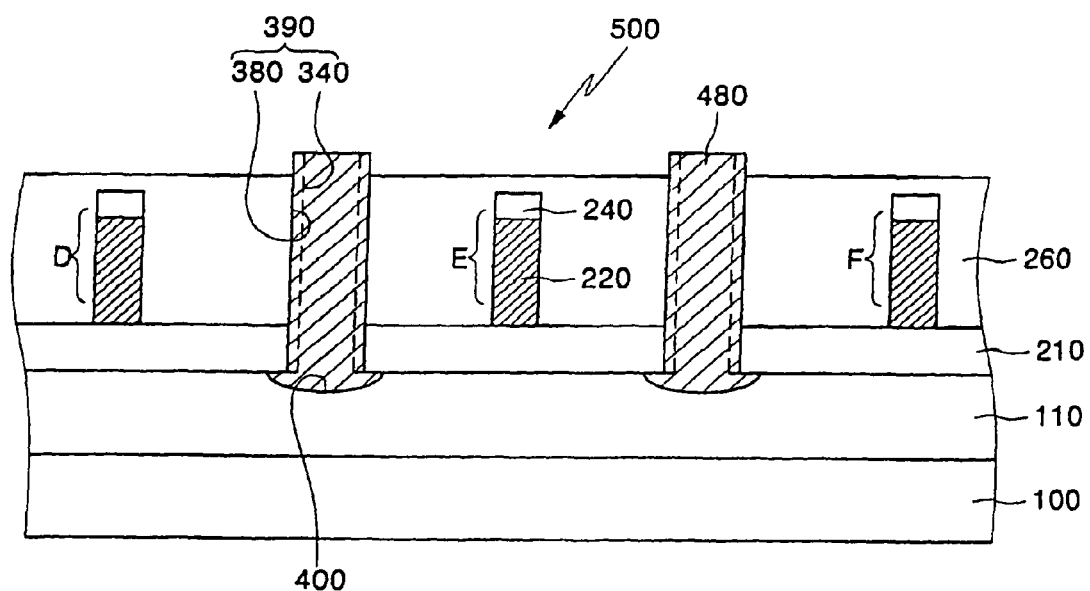

FIGS. 7, 9, and 11 are cross-sectional views along line I-I' of FIG. 4 for illustrating a method for fabricating the semiconductor fuse box according to a second embodiment of the present invention. Comparing FIGS. 6 and 7, the fuse supporting layer 210 is deposited onto the fuse buffer 110 in FIG. 7. Thus in FIG. 7, the support pads 200 and the supporting lines 150 are not formed in any wall supporting layer 170.

Further referring to FIG. 7, the fuse structures D, E, and F are formed onto the fuse supporting layer 210, and the passivation layer 260 is formed to surround the fuse structures D, E, and F. Referring to FIGS. 4, 7, and 9, the initial openings 300 are then patterned between the fuse structures D, E, and F in an anisotropic etch process using a patterned photoresist layer. The initial openings 300 are etched through the passivation layer 260 and the wall supporting layer 210.

Thereafter, an isotropic etch process is performed to expand the initial openings 300 that merge together to form the protective opening 390 with irregular sidewalls having dimples. In one embodiment of the present invention, the isotropic etch process is performed until the protective opening 390 etches into the fuse buffer 110, as illustrated in FIG. 9.

Subsequently in FIG. 9, a material 440 is deposited into the protective opening 390 to form a protective structure. Such a material also initially covers the passivation layer 260 in FIG. 9. Referring to FIG. 11, another etch process is performed on the material 440 to etch away the portion of the material 440 on the top surface of the passivation layer 260. The material 440 remaining within the protective opening 390 forms a protective structure 480 formed between the fuse structure E and another fuse structure F. And an additional protective structure 480 is formed between the fuse structure E and the fuse structure D.

In this manner, the fuse box 500 with the protective structures 480 in FIG. 11 is similar to that of FIG. 10. However, the support pad 200 and the support lines 150 at the bottom of the protective structures 480 in FIG. 10 are not present in FIG. 11.

Figure 12:
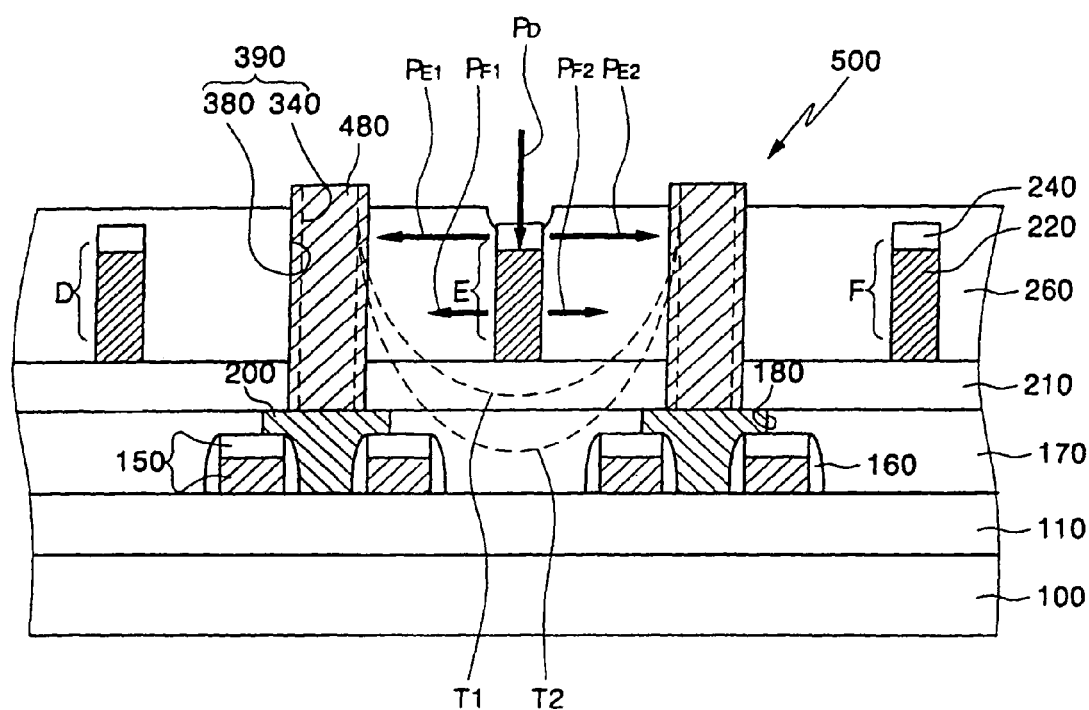
FIGS. 12 and 13 are cross-sectional views illustrating outlines of physical damage from irradiation of a laser beam in the semiconductor fuse boxes of FIGS. 10 and 11, respectively, according to first and second embodiments of the present invention.
Figure 13:
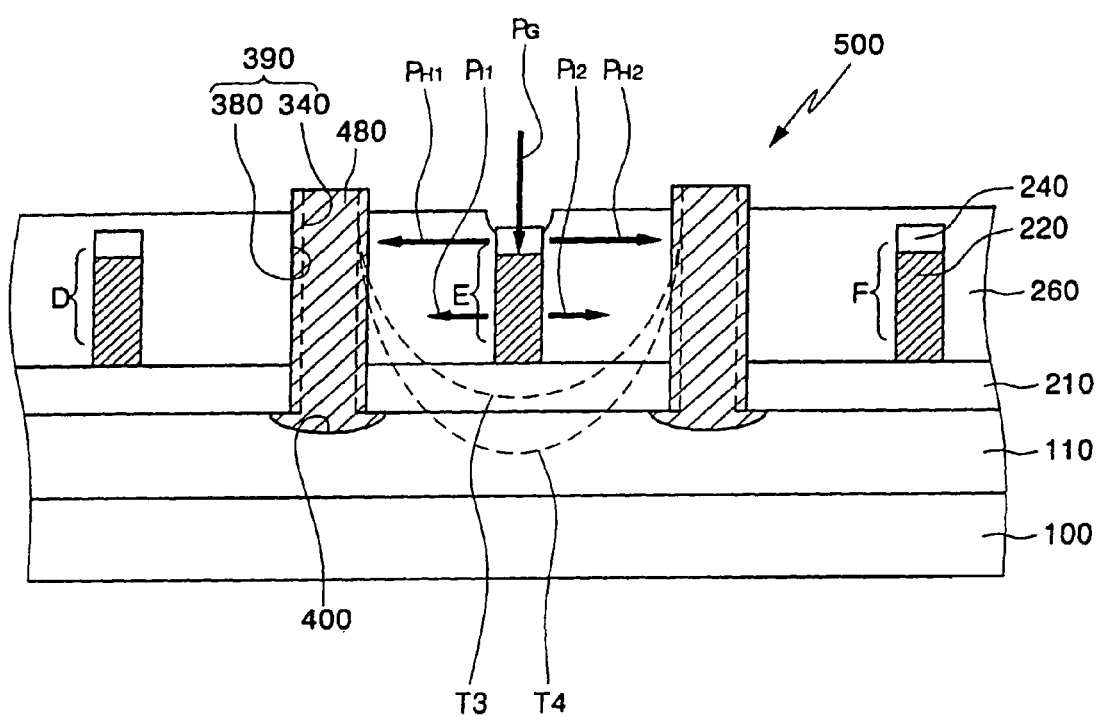

FIG. 12 shows the cross-sectional view of FIG. 10, and FIG. 13 shows the cross-sectional view of FIG. 11, when a laser beam is directed toward the fuse structure E. When such a laser beam is irradiated onto the fuse structure E, the protective structures 480 minimizes damage to the near-by fuse structures D and F.

The laser beam irradiated onto the fuse box 500 of FIG. 12 or 13 causes both stress and blowing attack on the passivation layer 260. Stress refers to a kind of strain on the passivation layer 260 as the laser beam is irradiated on the fuse E. Such a stress causes the passivation layer 260 to have a lattice structure different from a ground state without irradiation of the laser beam. Such a stress results when the atoms of the passivation layer 260 exhibit harmonic motion from energy of the laser beam.

When the passivation layer 260 is formed of more layers, the strain from the stress of such layers causes more severe cracking of the passivation layer 260. The strain or the crack within the passivation layer 260 acts as a path for transmission of the energy of the laser beam to the fuse structures D and F.

A blowing attack is caused by the harmonic motion of the atoms of the passivation layer 260 around the fuse E together with the stress. Such harmonic motion of the atoms caused by the energy of the laser beam is inversely proportional to a distance from the fuse E. With such harmonic motion, the atoms around the fuse E exit the ground state to form a distorted lattice or to escape from the passivation layer 260. The energy of the resulting laser beam after such distortion of the lattice of the passivation layer 260 is inversely proportional to the distance from the fuse E and to a thickness of the passivation layer 260.

The intensity of a harmonic wave of the atoms of the passivation layer 260 during irradiation of the laser beam is expressed as follows:

$$I = P/A \quad \text{(Equation 1)}$$

I is the intensity of the harmonic wave; P is the energy of the harmonic wave; and A is the area of the object against which the harmonic wave runs.

Referring to FIGS. 4, 12, and 13, when the harmonic wave runs against the irregular surface 391 of the protective structure 480, the effective area A is increased for such an irregular surface 391 (than if the surface were to be substantially flat). With such an increase in the area A, the intensity I of the harmonic wave is decreased resulting in less damage.

FIGS. 12 and 13 also illustrate traces T1, T2, T3, and T4 of physical damage during irradiation of the laser beam toward the fuse structure E. Referring to FIG. 12, a laser beam of energy $P_D$ is irradiated onto the fuse structure E resulting in damage traces T1 and T2 through the fuse structure E, the passivation layer 260, the fuse supporting layer 210, and the wall supporting layer 170. Similarly in FIG. 13, a laser beam of energy $P_G$ is irradiated onto the fuse structure E resulting in damage traces T3 and T4 through the fuse structure E, the passivation layer 260, the fuse supporting layer 210 and the fuse buffer 110.

Further referring to FIG. 12, the energy $P_D$ of the laser beam is divided into a plurality of energies $P_{E1}$, $P_{E2}$, $P_{F1}$ and $P_{F2}$ as the laser beam travels down and out from the fuse structure E though the passivation layer 260. Energies $P_{E1}$ and $P_{E2}$ result in damage to an upper portion of the passivation layer 260 exposing an upper portion of the facing side walls of the protective structures 480. Other energies $P_{F1}$ and $P_{F2}$ result in damage to a lower portion of the passivation layer 260 with an intensity weaker than that of the energies $P_{E1}$ and $P_{E2}$.

A groove of damage as indicated by the traces T1 and T2 is formed only between the protective walls 480 and the support pads 200. Thus, the adjacent fuse structures D and F are not exposed to the damaging force of the laser beam directed to the fuse structure E.

In addition, when the energies $P_{E1}$, $P_{E2}$, $P_{F1}$ and $P_{F2}$ of the laser beam arrive at the protective structures 480, the harmonic wave resulting from such energies has decreased intensity from the irregular side surfaces 391 of the protective structures 480.

The energy of the laser beam propagates down into the fuse supporting layer 210, wall supporting layer 170, and the fuse buffer 110. However, the support pads 200 and the fuse buffer 110 minimize such energy from being transmitted to the fuse structures D and F.

Similarly, referring to FIG. 13, the energy $P_G$ of the laser beam is divided into a plurality of energies $P_{H1}$, $P_{H2}$, $P_{I1}$, and $P_{I2}$ as the laser beam travels down and out from the fuse structure E though the passivation layer 260. When such energies $P_{H1}$, $P_{H2}$, $P_{I1}$ and $P_{I2}$ arrive at the protective structures 480 in FIG. 13, the harmonic wave resulting from such energies has decreased intensity from the irregular side surfaces 391 of the protective structures 480.

In addition, because the protective structures 480 extend beyond the top and the bottom of the fuse structure E, the transmission path for the energies of the laser beam to the fuse structures D and F is increased. Thus, the intensity of the energies reaching such fuse structures D and F is advantageously decreased in FIG. 13.

The foregoing is by way of example only and is not intended to be limiting. For example, the present invention herein is described for protection of other fuse structures D and F near the fuse structure E to be cut. However, the present invention may be used for protection of any other types of integrated circuit structures near the fuse structure to be irradiated with the laser beam. In addition, any materials mentioned herein are by way of example only.

Furthermore, the present invention has been described for using the semiconductor fuse box 500 when replacing inoperative memory cells with redundancy cells. However, the semiconductor fuse box 500 of the present invention may be used for any applications having a fuse to be cut by a laser beam such as programmable logic devices for example.

The present invention is limited only as defined in the following claims and equivalents thereof.

What is claimed is:

1. A semiconductor fuse box comprising:
   a fuse structure;
   a protective structure disposed between the fuse structure and an integrated circuit structure;
   a pad formed at a bottom of the protective structure; and
   support lines formed to the sides of the pad,
   wherein the pad and the support lines are formed at a lower depth from a bottom of the fuse structure.

2. The semiconductor fuse box of claim 1, wherein the support lines are comprised of one of polysilicon or a material having a melting point higher than that of the fuse structure.

3. The semiconductor fuse box of claim 1, wherein the pad is comprised of one of polysilicon or a material having a melting point higher than that of the fuse structure.

4. The semiconductor fuse box of claim 1, further comprising:
   an additional protective structure disposed between the fuse structure and another integrated circuit structure;
   an additional pad formed at a bottom of the additional protective structure; and
   additional support lines formed to the sides of the additional pad.

5. The semiconductor fuse box of claim 4, wherein the additional support lines are comprised of one of polysilicon or a material having a melting point higher than that of the fuse structure.

6. The semiconductor fuse box of claim 4, wherein the additional pad is comprised of one of polysilicon or a material having a melting point higher than that of the fuse structure.

7. The semiconductor fuse box of claim 4, wherein the additional pad and the additional support lines are formed at a lower depth from a bottom of the fuse structure.

8. The semiconductor fuse box of claim 4, wherein the fuse structure and the additional protective structure are surrounded by a passivation layer.

9. The semiconductor fuse box of claim 4, wherein the additional protective structure has at least one irregular side wall.

10. The semiconductor fuse box of claim 9, wherein the irregular side wall is comprised of a plurality of dimples.

11. The semiconductor fuse box of claim 4, wherein the additional protective structure extends beyond a top and a bottom of the fuse structure.

12. The semiconductor fuse box of claim 4, wherein the additional protective structure is disposed between the fuse structure and another fuse structure.

13. The semiconductor fuse box of claim 1, wherein the fuse structure and the protective structure are surrounded by a passivation layer.

14. The semiconductor fuse box of claim 1, wherein the protective structure has at least one irregular side wall.

15. The semiconductor fuse box of claim 14, wherein the irregular side wall is comprised of a plurality of dimples.

16. The semiconductor fuse box of claim 1, wherein the protective structure is disposed between the fuse structure and another fuse structure.

17. The semiconductor fuse box of claim 1, wherein the protective structure extends beyond a top and a bottom of the fuse structure.

\* \* \* \* \*